US009685556B2

(12) United States Patent
Cao et al.

(10) Patent No.: US 9,685,556 B2
(45) Date of Patent: Jun. 20, 2017

(54) THIN FILM TRANSISTOR AND PREPARATION METHOD THEREFOR, ARRAY SUBSTRATE, AND DISPLAY APPARATUS

(71) Applicant: BOE TECHNOLOGY GROUP CO., LTD., Beijing (CN)

(72) Inventors: Zhanfeng Cao, Beijing (CN); Zhen Liu, Beijing (CN); Feng Zhang, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/026,406

(22) PCT Filed: Dec. 5, 2014

(86) PCT No.: PCT/CN2014/093166
§ 371 (c)(1),
(2) Date: Mar. 31, 2016

(87) PCT Pub. No.: WO2016/008255
PCT Pub. Date: Jan. 21, 2016

(65) Prior Publication Data
US 2016/0225912 A1 Aug. 4, 2016

(30) Foreign Application Priority Data

Jul. 14, 2014 (CN) .......................... 2014 1 0334569

(51) Int. Cl.
*H01L 27/12* (2006.01)
*H01L 29/786* (2006.01)
(Continued)

(52) U.S. Cl.
CPC ........ *H01L 29/78618* (2013.01); *H01L 27/12* (2013.01); *H01L 27/127* (2013.01);
(Continued)

(58) Field of Classification Search
CPC .............................. H01L 29/78618
See application file for complete search history.

(56) References Cited

U.S. PATENT DOCUMENTS 9,240,485 B2 1/2016 Liu et al.
2002/0030189 A1 3/2002 Ishikawa
(Continued)

FOREIGN PATENT DOCUMENTS

CN 102651401 A 8/2012
CN 103219389 A 7/2013
(Continued)

OTHER PUBLICATIONS

International Search Report of PCT/CN2014/093166 in Chinese, mailed Apr. 15, 2015 with English translation.
(Continued)

*Primary Examiner* — Charles Garber
*Assistant Examiner* — Alia Sabur
(74) *Attorney, Agent, or Firm* — Collard & Roe, P.C.

(57) ABSTRACT

A thin film transistor and a preparation method therefor, an array substrate and a display apparatus. The thin film transistor comprises an active layer (4), an etched barrier layer (5) disposed on the active layer (4), and a source and drain (6) disposed on the etched barrier layer (5). The source and drain (6) are disposed on a same layer in a spaced manner. First via holes (7) are formed in the etched barrier layer (5), second via holes (8) are formed in positions in the active layer (4) corresponding to the first via holes (7). The source and drain (6) are connected to the active layer (4) through the first via holes (7) formed in the etched barrier layer (5) and the second via holes (8) formed in the active layer (4). Because two second via holes are formed in the active layer, a design value L1 of the channel region length of the active layer is shortened and a metal oxide semiconductor array
(Continued)

substrate with a narrow channel is formed and the charge rate is high, which helps to improve the display effect.

18 Claims, 7 Drawing Sheets

(51) Int. Cl.
    *H01L 29/22*     (2006.01)
    *H01L 29/24*     (2006.01)
    *H01L 29/66*     (2006.01)

(52) U.S. Cl.
    CPC .......... *H01L 27/1225* (2013.01); *H01L 29/22* (2013.01); *H01L 29/24* (2013.01); *H01L 29/66969* (2013.01); *H01L 29/786* (2013.01); *H01L 29/7869* (2013.01); *H01L 29/78696* (2013.01)

(56) References Cited

U.S. PATENT DOCUMENTS

| | | | |
|---|---|---|---|
| 2010/0006851 A1* | 1/2010 | Park | H01L 29/66757 257/72 |
| 2010/0148155 A1* | 6/2010 | Choi | H01L 29/78606 257/40 |
| 2012/0256176 A1 | 10/2012 | Yang et al. | |
| 2013/0264564 A1 | 10/2013 | Park et al. | |
| 2014/0077203 A1 | 3/2014 | Yuan | |
| 2014/0139774 A1 | 5/2014 | Tsai et al. | |
| 2015/0021572 A1* | 1/2015 | Amari | H01L 51/0021 257/40 |
| 2016/0247823 A1 | 8/2016 | Zuo et al. | |

FOREIGN PATENT DOCUMENTS

| | | |
|---|---|---|
| CN | 103545319 A | 1/2014 |
| CN | 104157695 A | 11/2014 |
| WO | 2016/008255 A1 | 1/2016 |

OTHER PUBLICATIONS

Notice of Transmittal of the International Search Report of PCT/CN2014/093166 in Chinese, mailed Apr. 15, 2015.

Written Opinion of the International Searching Authority of PCT/CN2014/093166 in Chinese, mailed Apr. 15, 2015 with English translation.

Chinese Office Action in Chinese Application No. 201410334569.1 mailed Jul. 4, 2016 with English translation.

* cited by examiner

US 9,685,556 B2

THIN FILM TRANSISTOR AND PREPARATION METHOD THEREFOR, ARRAY SUBSTRATE, AND DISPLAY APPARATUS

CROSS REFERENCE TO RELATED APPLICATIONS

This application is the National Stage of PCT/CN2014/093166 filed on Dec. 5, 2014, which claims priority under 35 U.S.C. §119 of Chinese Application No. 201410334569.1 filed on Jul. 14, 2014, the disclosure of which is incorporated by reference.

FIELD OF THE ART

Embodiments of the invention relate to a thin film transistor, a method for fabricating the same, an array substrate and a display device.

BACKGROUND

Currently, a new direction of development is to replace amorphous silicon (a-Si) thin film transistors (TFTs) with metal oxide TFTs as the latter have higher mobility. A regular metal oxide TFT may have any of the following three configurations: a back channel protection (ESL) type, a back channel etching (BCE) type, and a common planar (Complar) type. The last two types of metal oxide TFTs have some problems in terms of TFT characteristic and stability, as a result, the ESL type metal oxide TFTs have been widely researched and brought into mass production.

A metal oxide TFT used in an Advanced-Super Dimensional Switching (AD-SDS) technology is generally fabricated through a patterning process with seven masks (7 masks), which successively comprises steps of patterning a gate electrode, patterning an active layer 4, patterning an etch stop layer 5, patterning source and drain electrodes, patterning a first electrode, patterning a planarization layer and patterning a second electrode. To improve the stability of an array substrate, the source and drain electrodes are connected to the active layer 4 respectively through via holes.

SUMMARY

A first aspect of the invention provides a thin film transistor, comprising: an active layer, an etch stop layer disposed on the active layer as well as a source electrode and a drain electrode disposed on the etch stop layer, wherein the source electrode and the drain electrode are disposed in a same layer and separated from each other, a first via hole is formed in the etch stop layer, a second via hole is formed in a position of the active layer corresponding to the first via hole, and each of the source electrode and the drain electrode is connected to the active layer through the first via hole formed in the etch stop layer and the second via hole formed in the active layer.

A second aspect of the invention provides a method for fabricating a thin film transistor, comprising:
 forming an active layer of the thin film transistor;
 forming an etch stop layer on the active layer;
 forming a first via hole in the etch stop layer;
 forming a second via hole in a position of the active layer corresponding to the first via hole;
 forming a source electrode and a drain electrode of the thin film transistor, wherein each of the source electrode and the drain electrode is connected to the active layer through the first via hole and the second via hole.

A third aspect of the invention provides an array substrate comprising the above thin film transistor.

A fourth aspect of the invention provides a display device comprising the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES 1. base substrate; 2. gate electrode; 3. gate insulation layer; 4. active layer; 5. etch stop layer; 6. source electrode and drain electrode; 7. first via hole; 8. second via hole; 9. third via hole; 10. electrically conductive layer; 11. photoresist.

DETAILED DESCRIPTION

Figure 1:
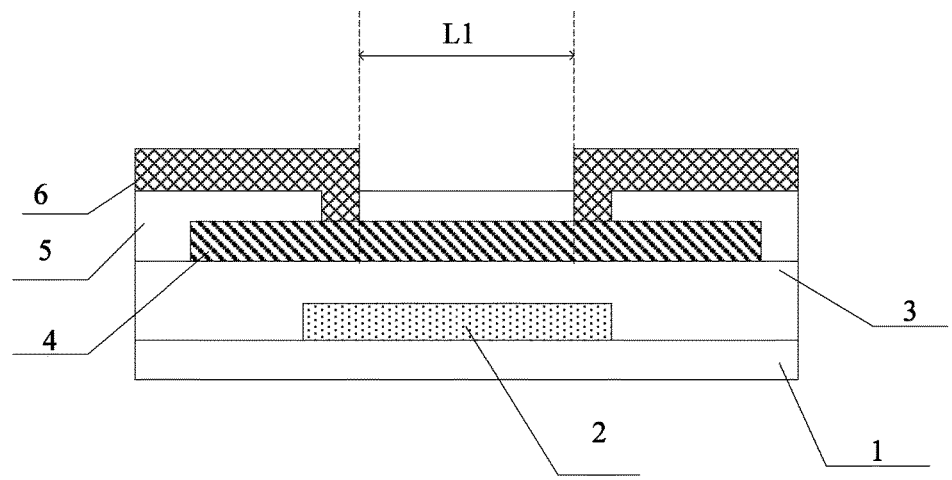
FIG. 1 schematically illustrates a cross section of some functional layers of a metal oxide semiconductor array substrate in conventional technologies.

FIG. 1 schematically illustrates a cross section of some functional layers of a metal oxide thin film transistor (TFT) known in conventional technologies. The metal oxide TFT comprises a base substrate 1, a gate electrode 2 disposed on the base substrate 1, a gate insulation layer 3 disposed on the gate electrode 2, an active layer 4 disposed on the gate insulation layer 3, an etch stop layer 5 disposed on the active layer 4, as well as source and drain electrodes 6 disposed on the etch stop layer. The source and drain electrodes 6 are disposed in a same layer and separated from each other; the source and drain electrodes 6 are connected to the active layer 4 respectively through via holes (not illustrated in FIG. 1, material of the source and drain electrode is formed in the via hole) formed in the etch stop layer 5 to guarantee the connection between the source and drain electrodes 6 and the active layer 4.

As illustrated in FIG. 1, L1 is a design value of a channel length of the active layer 4. Generally the design value L1 of the channel length of the metal oxide active layer 4 is larger, for example, L1 is 10 µm. Generally, due to the resolution limit of the exposure machine, a design value of a distance between the source electrode 6 and the drain electrode 6 is 4 µm or larger than 4 µm, an etching deviation of the source and drain electrodes 6 is 2 µm, and an etching deviation of the etch stop layer 5 is approximately 1 µm. Sufficient process margin is needed to guarantee that the source and drain electrodes can overlay the via holes in the etch stop layer 5 completely, and the process margin is designed as 3 µm. Due to the above fact, the design value L1 of the channel length of the active layer 4 is at least 10 µm.

In contrast, a design value of a channel length of an active layer 4 in an a-Si TFT is 4 µm. In condition that the channels have the same width, the larger the design value L1 of a channel length is, the smaller the ratio between the channel width and the channel length is, and the lower the charging rate is, thereby compromising the display effect.

As the design value of the channel length of the active layer 4 in the metal oxide TFT is much larger than that of the channel length of the active layer 4 in the a-Si TFT, the active layer 4 in the metal oxide TFT has a higher mobility. Nevertheless, the large design value of the channel length of the active layer 4 seriously restricts the increasing of the property of the metal oxide TFT.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 2:
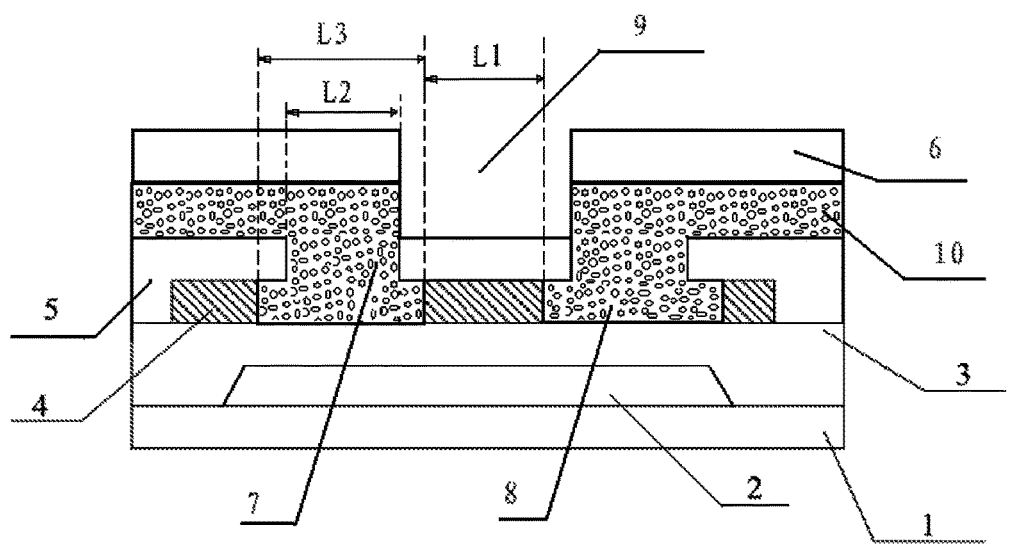
FIG. 2 schematically illustrates a cross section of some functional layers of a metal oxide semiconductor array substrate in accordance with an embodiment of the invention.

As illustrated in FIG. 2, an embodiment of the invention provides a thin film transistor and a method for fabricating the same, which will be described by taking a bottom gate TFT as an example. It can be understood that the following description is also applicable to a top gate TFT.

As illustrated in FIG. 2, the thin film transistor of the embodiment comprises: an active layer 4, an etch stop layer 5 disposed on the active layer 4 as well as source and drain electrodes 6 disposed on the etch stop layer 5, wherein the source and drain electrodes 6 are disposed in a same layer and separated from each other. Two first via holes 7 are formed in the etch stop layer 5, two second via holes 8 are formed in positions of the active layer 4 corresponding to the first via holes 7. Each of the source and drain electrodes 6 is connected to the active layer 4 through the first via hole 7 formed in the etch stop layer 5 and the second via hole 8 formed in the active layer 4.

Compared with conventional technologies where no via holes are formed in the active layer, the active layer 4 in the embodiment of the invention has the second via holes 8 formed therein, which shortens the channel length of the active layer 4, thereby forming a narrow channel TFT with a high charging rate, which increases the display effect.

As an example, a length L3 of the second via hole 8 is larger than a length L2 of the first via hole 7.

As the length L3 of the second via hole 8 is larger than the length L2 of the first via hole 7, the channel length of the active layer 4 is further shortened. The channel length L1 as illustrated in FIG. 2 is shortened to form a narrow channel TFT with a high charging rate, which increase the display effect.

As the source and drain electrodes 6 cannot be formed through a conventional sputtering process due to the fact that the length L3 of the second via hole 8 is larger than the length L2 of the first via hole 7, the TFT further comprises an electrically conductive layer 10, wherein the source and drain electrodes 6 are disposed on the electrically conductive layer 10, and the source and drain electrodes 6 are connected to the active layer 4 through the electrically conductive layer 10.

As an example, the electrically conductive layer 10 comprises an electrically conductive adhesive, and the electrically conductive adhesive comprises nanoparticles, the material of the nanoparticles, which material comprises at least one of silver, copper or aluminum. a fluidic electrically conductive adhesive can flow into the second via hole 8 with a larger length through the first via hole 7 with a smaller length, thereby filling up the two via holes and connecting the source and drain electrodes 6 to the active layer 4.

As an example, the active layer 4 is made of metal oxide semiconductor materials such as IGZO, ZnO or ITZO, such that the TFT has a higher mobility.

It can be understood that, the above TFT may further comprise other functional layers, such as a planarization layer disposed on the source and drain electrode 6, an indium tin oxide layer disposed on the planarization layer, which can be added based on specific application.

As illustrated in FIGS. 3 to 10, a method for fabricating the above TFT comprises:

Step 1). forming an active layer 4 of the thin film transistor;

Step 2). forming an etch stop layer 5 on the active layer 4;

Step 3). forming a first via hole 7 in the etch stop layer 5;

Step 4). forming a second via hole 8 in a position of the active layer 4 corresponding to the first via hole 7;

Step 5). forming source and drain electrodes 6 of the thin film transistor, wherein each of the source and drain electrodes 6 is connected to the active layer 4 through the first via hole 7 and the second via hole 8.

Figure 3:
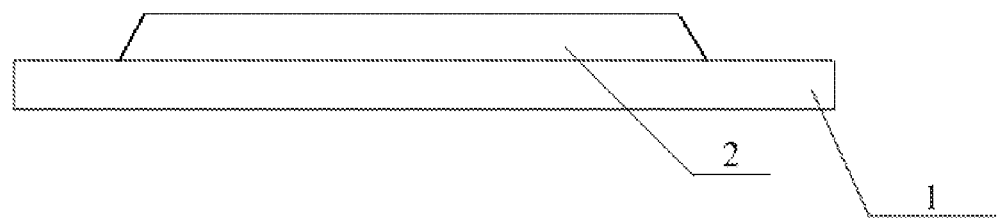
FIG. 3 schematically illustrates a cross section of a metal oxide semiconductor array substrate after a pattern of a gate electrode is formed in accordance with an embodiment of the invention.

As an example, the method comprises:

Step a): providing a base substrate, and forming a pattern of a gate electrode made of a gate metal layer on the base substrate;

As illustrated in FIG. 3, a pattern comprising a gate electrode 2 is first formed on a base substrate 1 by way of a patterning process performed on a gate metal layer, wherein the base substrate is a glass substrate or a quartz substrate.

As an example, a gate metal layer is deposited on the base substrate 1 by way of sputtering or heat evaporation. Material of the gate metal layer may be metals such as Cr, W, Ta, Mo, Al, Cu, etc. or alloy thereof. The gate metal layer may be made up of a plurality of metal films. After that, a layer of photoresist is applied on the gate metal layer, and the photoresist is exposed using a mask to form a photoresist-removed region and a photoresist-retained region. The photoresist-retained region corresponds to a region having the pattern of the gate electrode 2, and the photoresist-removed region corresponds to a residual region not having the above pattern. Next, a developing process is performed so that the photoresist in the photoresist-removed region is completely removed and a thickness of the photoresist in the photoresist-retained region remains the same. The gate metal film in the photoresist-removed region is etched off completely by way of an etching process to form the pattern of the gate electrode 2. Finally, the remaining photoresist is peeled off.

Figure 4:
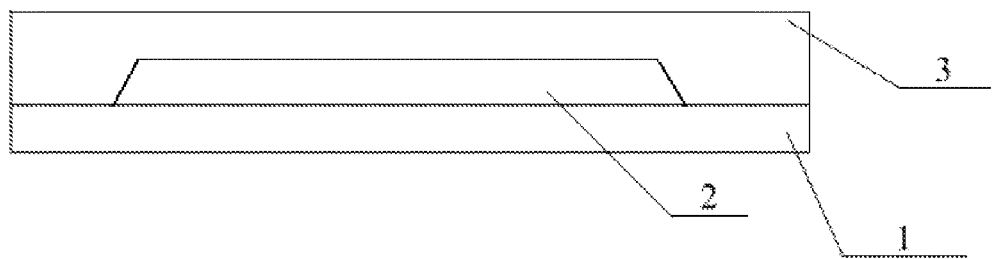
FIG. 4 schematically illustrates a cross section of a metal oxide semiconductor array substrate after a pattern of a gate insulation layer is formed in accordance with an embodiment of the invention.

Step b): as illustrated in FIG. 4, forming a gate insulation layer 3 on the base substrate having the gate electrode formed thereon;

As an example, a plasma enhanced chemical vapor deposition (PECVD) method can be used to deposit a material of the gate insulation layer 3 having a thickness of 1000 Å~4000 Å on the base substrate 1 done with step a), thereby forming the gate insulation layer 3, wherein the material of the gate insulation layer 3 may be oxide, nitride or nitrogen oxide, and the gate insulation layer 3 may be in a single-layer, dual-layer or multi-layer structure.

Figure 5:
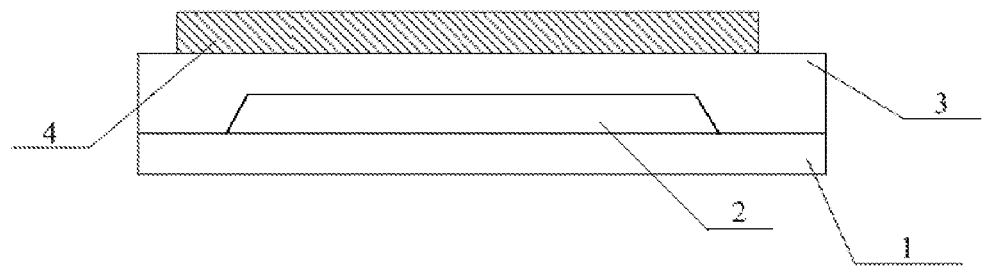
FIG. 5 schematically illustrates a cross section of a metal oxide semiconductor array substrate after a pattern of an active layer is formed in accordance with an embodiment of the invention.

Step c): depositing a layer of metal oxide semiconductor on the base substrate having the gate insulation layer formed thereon to form the active layer;

As an example, as illustrated in FIG. 5, IGZO is deposited on the base substrate done with step b) by way of magnetron sputtering, thermal evaporation or other film formation methods to form the active layer 4, where a thickness of the IGZO is 10 mm~50 mm.

Next, a photoresist is first applied onto the active layer 4 and then exposed to form a photoresist-removed region and a photoresist-retained region. After that, a developing process is performed, such that the photoresist in the photoresist-removed region is completely removed and the thickness of the photoresist in the photoresist-retained region remains the same. An etching process is then used to etch off the metal oxide semiconductor layer in the photoresist-removed region completely to form the pattern of the active layer 4 which is illustrated in FIG. 5. Finally the rest of the photoresist in the photoresist-retained region is peeled off.

The metal oxide active layer 4 has a higher mobility.

Figure 6:
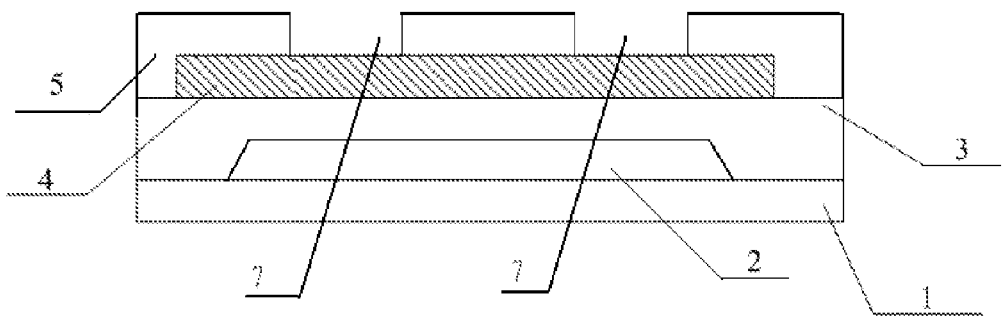
FIG. 6 schematically illustrates a cross section of a metal oxide semiconductor array substrate after a pattern of an etch stop layer is formed in accordance with an embodiment of the invention.

Step d): as illustrated in FIG. 6, forming a pattern of the etch stop layer on the base substrate, and forming first via holes 7 in the etch stop layer 5.

As an example, a material of the etch stop layer 5 is deposited on the base substrate 1 done with step c) by way of magnetron sputtering, thermal evaporation or other film formation methods. The material of the etch stop layer 5 may be oxide or nitride. SiO2 is used as the etch stop layer 5 in the embodiment of the invention. The succeeding step comprises: applying a layer of photoresist on the etch stop layer 5, exposing the photoresist using a mask to form a photoresist-removed region and a photoresist-retained region; the photoresist-retained region corresponds to a region having the pattern of the etch stop layer 5, and the photoresist-removed region comprises a region having the first via holes 7; applying a developing process and a dry etch process using gas mixture of CF4 and oxygen, so that the photoresist in the photoresist-removed region is completely removed and the thickness of the photoresist in the photoresist-retained region remains the same; etching off the etch stop layer 5 in the photoresist-removed region completely by way of an etching process to form the pattern of the etch stop layer 5.

It can be understood that, the step of forming the first via holes 7 in the etch stop layer 5 and the step of forming the second via holes 8 in positions corresponding to the first via holes 7 (step e)) can be accomplished by way of one patterning process. Herein the so-called single patterning process is to form both the first and second via holes by way of a single mask process, which comprises processes of applying photoresist, exposing, developing, ashing, etching, and so on. Specifically, the etch stop layer 5 is exposed and developed using a single mask; then the first via holes 7 are formed through a dry etch process and the second via holes 8 are formed through a wet etch process (for details refer to step e)).

Figure 7:
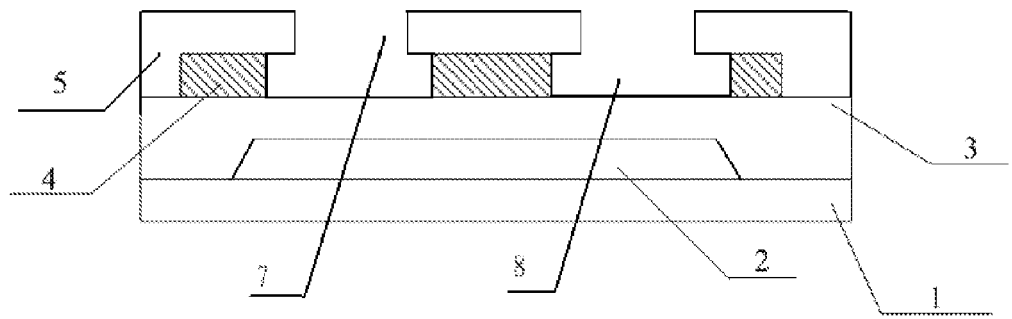
FIG. 7 schematically illustrates a cross section of a metal oxide semiconductor array substrate after a pattern of a second via hole is formed in accordance with an embodiment of the invention.

Step e): as illustrated in FIG. 7, forming the second via holes in the active layer;

Next, the active layer 4 made of IGZO is etched through a wet etch process using an etchant obtained from mixing H2SO4 and HNO3, so as to form the second via holes 8 as illustrated in FIG. 7. The rest of the photoresist is peeled off after the etching process is finished.

Compared with the situation where no via hole is formed in the active layer in conventional technology, the embodiment of the invention where the active layer has the second via holes 8 shortens the channel length of the active layer, thereby forming a narrow channel TFT with a high charging rate, which increase the display effect.

As an example, the etching time is controlled so that a length L3 of the second via hole 8 is larger than the length L2 of the first via hole 7. As the length L3 of the second via hole 8 is larger than the length L2 of the first via hole 7, the channel length of the active layer 4 is further shortened, thereby forming a narrow channel TFT with a high charging rate, which increase the display effect.

Figure 8:
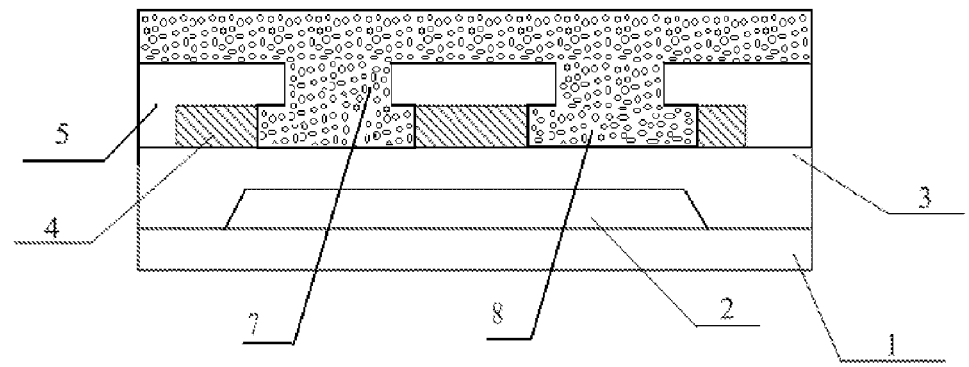
FIG. 8 schematically illustrates a cross section of a metal oxide semiconductor array substrate after a pattern of an electrically conductive layer is formed in accordance with an embodiment of the invention.

Step f): as illustrated in FIG. 8, applying an electrically conductive layer on the base substrate done with step e) by way of a coating method;

As an example, as the length L3 of the second via hole 8 is larger than the length L2 of the first via hole 7, the material of the source and drain electrodes 6 cannot be deposited into the second via holes 8 directly, thus the electrically conductive material in fluid state is needed to fill the second via holes 8. The fluidic conductive layer 10 can flow into and fill up the second via holes 8 through the apertures of the first via hole 7, thereby forming an electrically conductive channel running through the first via holes 7 and the second via holes 8.

Therefore, the electrically conductive layer 10 is made of an electrically conductive adhesive. For example, the electrically conductive adhesive comprising nanoparticles, which material comprises at least one of silver, copper or aluminum. It can be understood that, the above electrically conductive adhesive may also be a silver ink which is coated directly and then cured.

It can be understood that, the electrically conductive layer 10 may also be patterned to form the pattern of the source and drain electrodes 6, that is, to fabricate the source and drain electrodes 6 from the electrically conductive layer 10.

Figure 9:
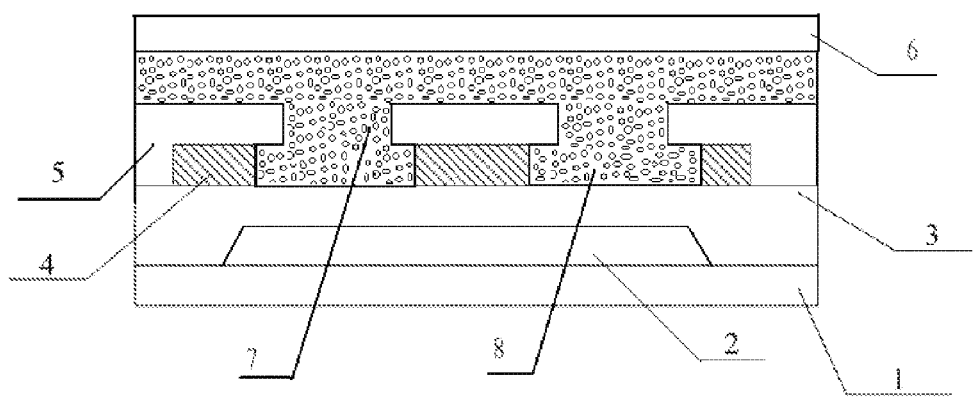
FIG. 9 schematically illustrates a cross section of a metal oxide semiconductor array substrate after patterns of a source and drain metal layer are formed in accordance with an embodiment of the invention.
Figure 10:
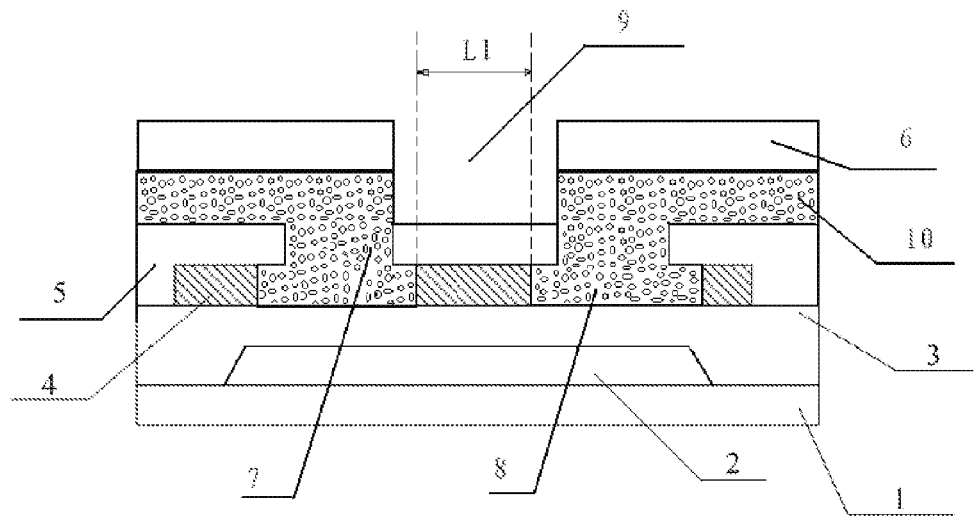
FIG. 10 schematically illustrates a cross section of a metal oxide semiconductor array substrate after patterns of source and drain electrodes and an electrically conductive layer are formed in accordance with an embodiment of the invention.

Step g): depositing a source and drain metal layer on the base substrate done with step f), thereby forming the source and drain electrodes by way of a patterning process;

For example, as illustrated in FIG. 9, a source and drain metal layer is deposited on the base substrate 1 done with step f) by way of magnetron sputtering, heat evaporation or other film formation methods. Material of the source and drain electrode metal layer may be metal such as Cr, W, Ta, Mo, Al, Cu and the like or alloy thereof. The source and drain metal layer may be made up of a plurality of metal films. The succeeding steps comprise: applying a layer of photoresist on the source and drain metal layer, exposing the photoresist using a mask to form a photoresist-removed region and a photoresist-retained region; the photoresist-retained region corresponds to a region having the pattern of the source and drain electrodes, and the photoresist-removed region corresponds to a resident region other than the above region; applying a developing process so that the photoresist in the photoresist-removed region is completely removed and the thickness of the photoresist in the photoresist-retained region remains the same; as illustrated in FIG. 10, etching off the source and drain electrode metal film and the electrically conductive layer 10 in the photoresist-removed region completely by way of an etching process to form the pattern of the source and drain electrodes 6 and a third via hole 9; peeling off the rest of the photoresist. That is, the patterns of electrically conductive layer 10 and the source and drain electrodes 6 are formed through one patterning process.

It can be understood that, a passivation layer, a pixel electrode or other functional layers may be further formed by way of known patterning process to finally form the thin film transistor, which will not be elaborated herein.

In the embodiment, as the fabricated TFT has the second via holes 8 disposed in the active layer 4, the channel length of the active layer 4 is shortened, thereby forming a narrow channel TFT with a higher charging rate, thus the display effect is increased.

Example 2

As illustrated in FIGS. 11 to 18, an embodiment of the invention provides a thin film transistor and a method for fabricating the same.

Figure 11:
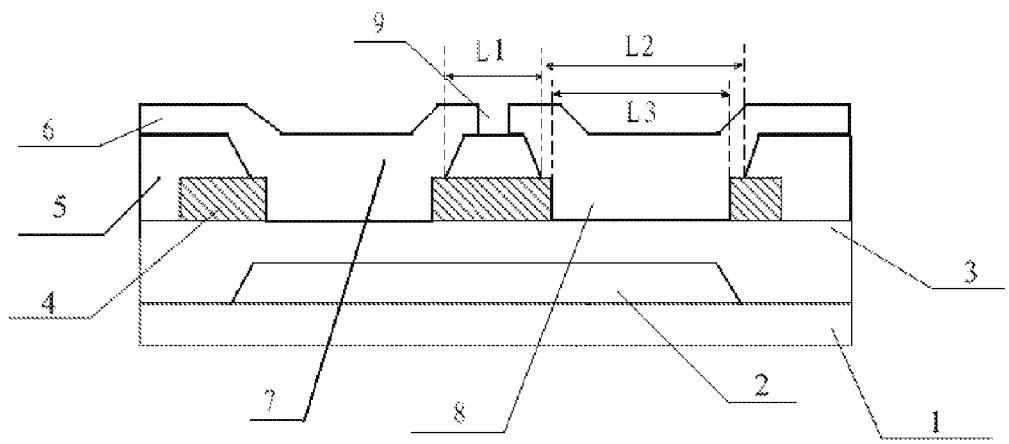
FIG. 11 schematically illustrates a cross section of some functional layers of a metal oxide semiconductor array substrate in accordance with another embodiment of the invention.

As illustrated in FIG. 11, the thin film transistor comprises: an active layer 4, an etch stop layer 5 disposed on the active layer 4 as well as a source electrode 6 and a drain electrode 6 disposed on the etch stop layer 5. The source and drain electrodes 6 are disposed in a same layer and separated from each other. First via holes 7 are formed in the etch stop layer 5, second via holes 8 are formed in positions of the active layer 4 corresponding to the first via holes 7, each of the source and drain electrodes 6 is connected to the active layer 4 through one of the first via holes 7 formed in the etch stop layer 5 and the corresponding second via hole 8 formed in the active layer 4. Herein, a length L2 of the first via hole 7 is larger than a length L3 of the second via hole 8, and the source and drain electrodes 6 contact a surface of part of the active layer 4 facing the etch stop layer 5. As the surface of the part of the active layer 4 contacts the source and drain electrodes 6, the contact property between the source and drain electrodes and the active layer is increased, thereby decreasing the contact resistance, increasing the performance of the transistor and further shortening the channel length L1 of the active layer.

As an example, the active layer 4 is made of metal oxide semiconductor material and has a higher mobility.

It can be understood that, the above TFT may further comprise other functional layers such as a planarization layer disposed on the source and drain electrodes 6, an indium tin oxide layer disposed on the planarization layer, which can be added as specific application.

As illustrated in FIGS. 11 to 19, the method for fabricating the TFT comprises:

Step 1). forming an active layer 4 of the thin film transistor;

Step 2). forming an etch stop layer 5 on the active layer 4;

Step 3). forming a first via hole 7 in the etch stop layer 5;

Step 4). forming a second via hole 8 in a position of the active layer 4 corresponding to the first via hole 7;

Step 5). forming the source and drain electrodes 6 of the thin film transistor, wherein each of the source and drain electrodes 6 is connected to the active layer 4 through the first via hole 7 and the second via hole 8.

Figure 12:
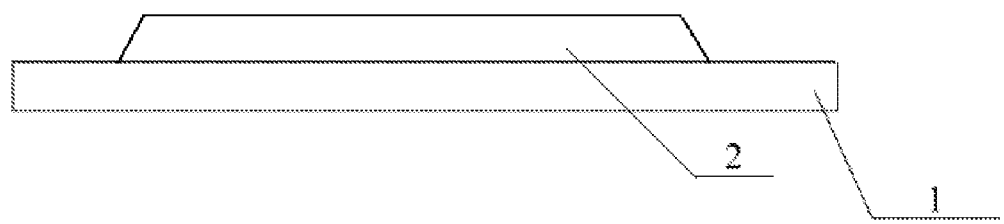
FIG. 12 schematically illustrates a cross section of a metal oxide semiconductor array substrate after a pattern of a gate electrode is formed in accordance with another embodiment of the invention.

As an example, the method comprises:

Step a): providing a base substrate, and forming a pattern of a gate electrode made of a ate metal layer on the base substrate;

As illustrated in FIG. 12, a pattern comprising a gate electrode 2 is first formed on a base substrate 1 by way of a patterning process performed on a gate metal layer, wherein the base substrate is a glass substrate or a quartz substrate.

As an example, a gate metal layer is deposited on the base substrate 1 by way of sputtering or heat evaporation. Material of the gate metal layer may be metals such as Cr, W, Ta, Mo, Al, Cu, etc. or alloy thereof. The gate metal layer may be made up of a plurality of metal films. After that, a layer of photoresist is applied on the gate metal layer, and the photoresist is exposed using a mask to form a photoresist-removed region and a photoresist-retained region. The photoresist-retained region corresponds to a region having the pattern of the gate electrode 2, and the photoresist-removed region corresponds to a residual region not having the above pattern. Next, a developing process is performed so that the photoresist in the photoresist-removed region is completely removed and a thickness of the photoresist in the photoresist-retained region remains the same. The gate metal film in the photoresist-removed region is etched off completely by way of an etching process to form the pattern of the gate electrode 2. Finally, the remaining photoresist is peeled off.

Figure 13:
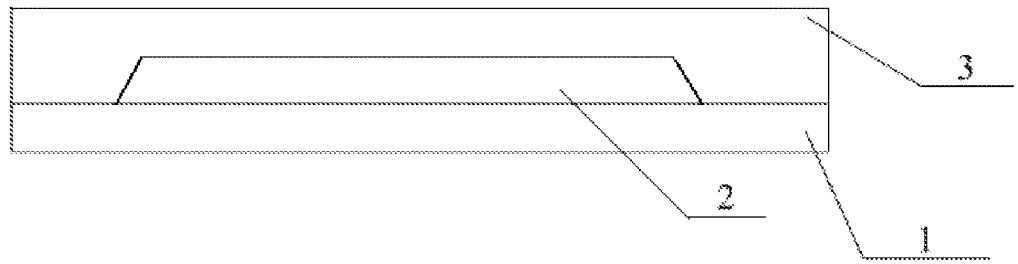
FIG. 13 schematically illustrates a cross section of a metal oxide semiconductor array substrate after a pattern of a gate insulation layer is formed in accordance with another embodiment of the invention.

Step b): as illustrated in FIG. 13, forming a gate insulation layer 3 on the base substrate having the gate electrode formed thereon;

As an example, a plasma enhanced chemical vapor deposition (PECVD) method can be used to deposit a material of the gate insulation layer 3 having a thickness of 1000 Å~4000 Å on the base substrate 1 done with step a), thereby forming the gate insulation layer 3, wherein the material of the gate insulation layer 3 may be oxide, nitride or nitrogen oxide, and the gate insulation layer 3 may be in a single-layer, dual-layer or multi-layer structure.

Figure 14:
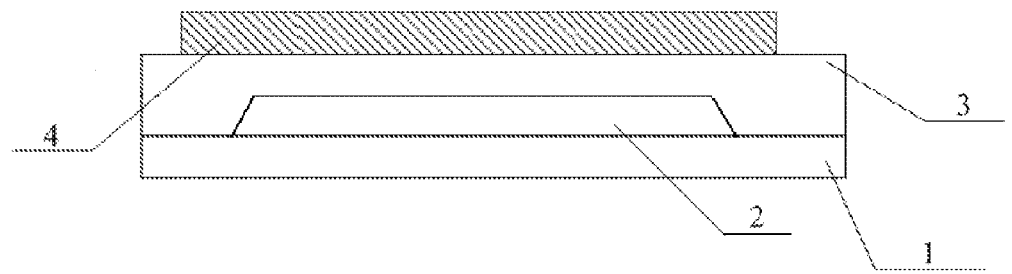
FIG. 14 schematically illustrates a cross section of a metal oxide semiconductor array substrate after a pattern of an active layer is formed in accordance with another embodiment of the invention.

Step c): depositing a layer of metal oxide semiconductor on the base substrate having the gate insulation layer formed thereon to form the active layer;

As an example, as illustrated in FIG. 14, IGZO is deposited on the base substrate done with step b) by way of magnetron sputtering, thermal evaporation or other film formation methods to form the active layer 4, where a thickness of the IGZO is 10 mm-50 mm.

Next, a photoresist is first applied onto the active layer 4 and then exposed to form a photoresist-removed region and a photoresist-retained region. After that, a developing process is performed such that the photoresist in the photoresist-removed region is completely removed and the thickness of the photoresist in the photoresist-retained region remains the same. An etching process is then used to etch off the metal oxide semiconductor layer in the photoresist-removed region completely to form the pattern of the active layer 4. Finally the rest of the photoresist in the photoresist-retained region is peeled off.

The metal oxide active layer 4 has a higher mobility.

Figure 15:
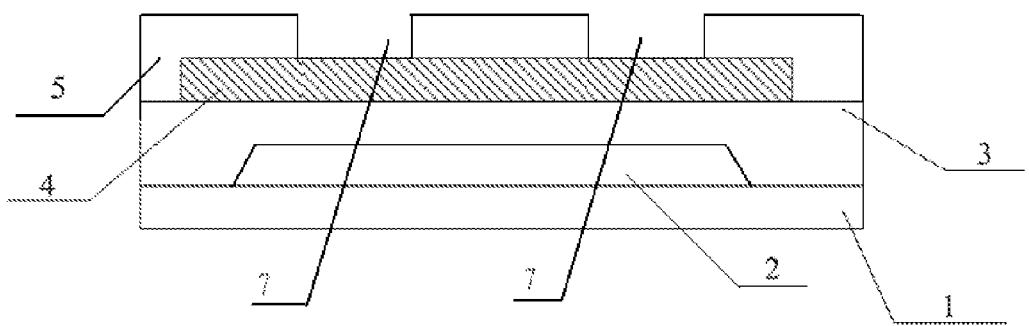
FIG. 15 schematically illustrates a cross section of a metal oxide semiconductor array substrate after a pattern of an etch stop layer is formed in accordance with another embodiment of the invention.

Step d): as illustrated in FIG. 15, forming a pattern of the etch stop layer on the base substrate, and forming the first via holes 7 in the etch stop layer 5.

As an example, a material of the etch stop layer 5 is deposited on the base substrate 1 done with the step c) by way of magnetron sputtering, thermal evaporation or other film formation methods, wherein the material of the etch stop layer 5 may be oxide or nitride. SiO2 is used as the etch stop layer 5 in the embodiment of the invention. After that, a layer of photoresist 11 is applied on the etch stop layer 5, and then exposed using a mask to form a photoresist-removed region and a photoresist-retained region; the photoresist-retained region corresponds to a region having the pattern of the etch stop layer 5, and the photoresist-removed region comprises a region having the above first via holes 7. Then, a developing process is performed and a dry etch process using gas mixture of CF4 and oxygen is used to completely remove the photoresist in the photoresist-removed region and the thickness of the photoresist in the photoresist-retained region remains the same. The etch stop layer 5 in the photoresist-removed region is etched off completely by way of an etching process to form the pattern of the etch stop layer 5.

It can be understood that, the step of forming the first via holes 7 in the etch stop layer 5 and the step of forming the second via holes 8 in positions corresponding to the first via holes 7 are accomplished by way of one patterning process.

The so-called single patterning process is to form both the first and second via holes by way of a single mask process, which comprises processes of applying photoresist, exposing, developing, ashing, etching, and so on. Specifically, the etch stop layer 5 is exposed and developed using a single mask; then the first via holes 7 are formed through a dry etch process and the second via holes 8 are formed through a wet etch process (for details refer to step e)).

Figure 16:
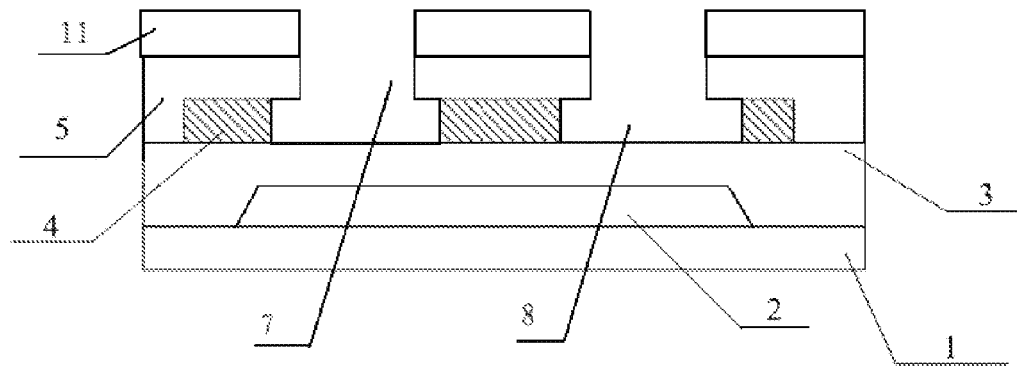
FIG. 16 schematically illustrates a cross section of a metal oxide semiconductor array substrate after a pattern of a second via hole is formed in accordance with another embodiment of the invention.

Step e): as illustrated in FIG. 16, forming the second via hole in the active layer;

Next, the active layer 4 made of IGZO is etched through a wet etch process using an etchant obtained from mixing H2SO4 and HNO3 to form the second via holes 8 as illustrated in FIG. 7. The rest of the photoresist is peeled off after the etching process is finished. The second via holes 8 being disposed in the active layer 4 shortens a channel length of the active layer 4, so as to form a narrow channel TFT with a higher charging rate, which increases the display effect. As an example, it is possible to control the etching time so that a length L3 of the second via hole 8 is larger than the length of the first via hole 7, thereby further shortening the channel length of the active layer 4 to form a narrow channel TFT.

Figure 17:
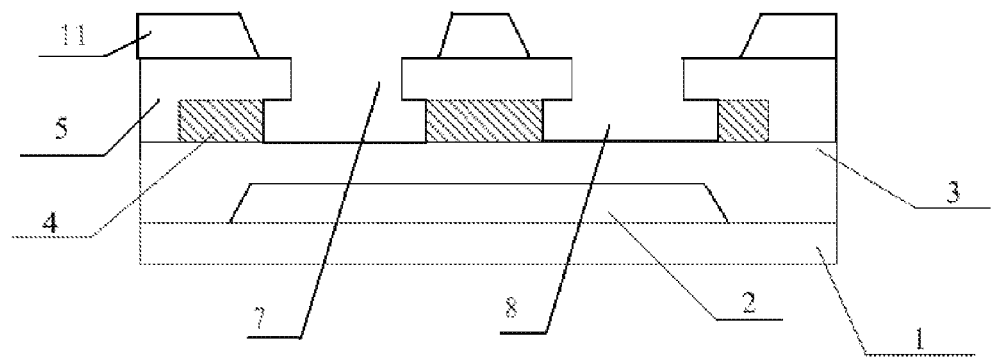
FIG. 17 schematically illustrates a cross section of a metal oxide semiconductor array substrate after ashing a photoresist on the etch stop layer in accordance with another embodiment of the invention.

Step f): enlarging the first via hole in the etch stop layer;

As the length L3 of the second via hole 8 is larger than the length of the first via hole 7, the source and drain electrodes 6 cannot be directly fabricated through deposition method, thus the first via hole 7 need to be enlarged. FIG. 17 illustrated the step of ashing the photoresist 11 formed on the etch stop layer 5 in positions corresponding to two opposite sides of the first via holes, so as to form an exposed part of the etch stop layer.

As an example, as illustrated in FIG. 17, the ashing process is performed on the photoresist 11 on two opposite sides of the first via hole 5 using a gas mixture of CF4 and oxygen to expose part of the etch stop layer 5 and etch the exposed part of the etch stop layer 5.

Figure 18:
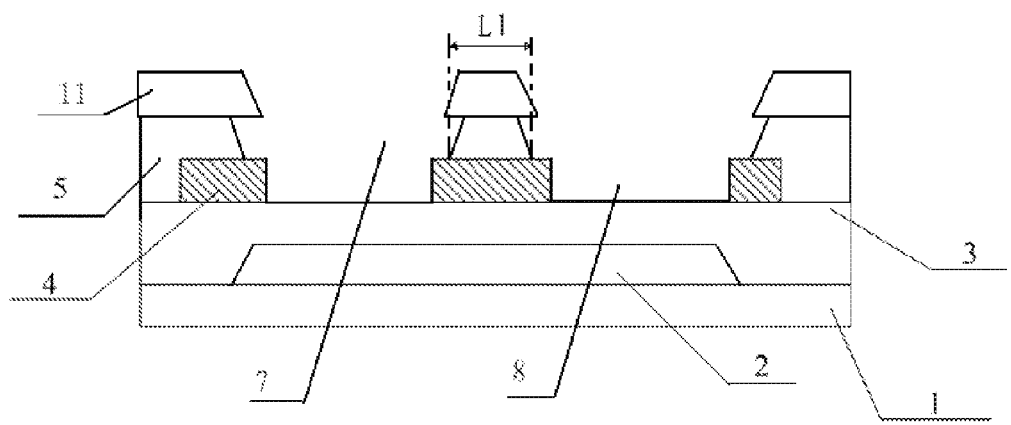
FIG. 18 schematically illustrates a cross section of a metal oxide semiconductor array substrate after enlarging first via holes in the etch stop layer in accordance with another embodiment of the invention.

Step g: etching the etch stop layer for a second time;

As illustrated in FIG. 18, a dry etch process using a gas mixture of CF4 and oxygen is used to etch the first via holes 7 in the etch stop layer 5 again, so that the length L2 of the first via hole 7 is larger than the length L3 of the second via hole 8, which makes it convenient to directly fabricate the subsequent source and drain electrodes 6 using deposition method, instead of fabricating an electrically conductive layer 10 from an electrically conductive adhesive and respectively connecting the electrically conductive layer 10 to the active layer 10 and the source and drain electrodes 6.

After etching the etch stop layer 5 once again, the surface of part of the active layer 4 facing the etch stop layer 5 is exposed and then contacts the source and drain electrodes 6 when the source and drain electrodes 6 are subsequently deposited, such that the source and the drain electrodes 6 contact the active layer 4 better. At the same time, as the surface of the part of the active layer facing the etch stop layer 5 contacts the source and drain electrodes 6, the channel length L1 of the active layer is further shortened.

Figure 19:
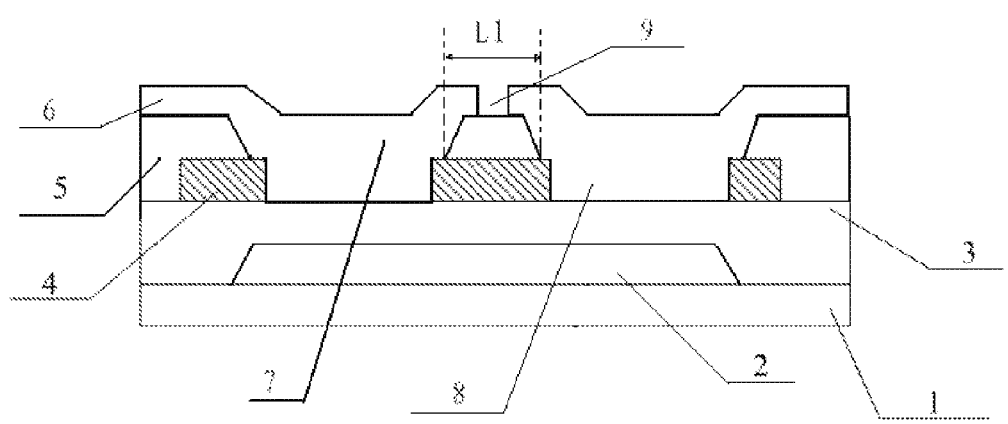
FIG. 19 schematically illustrates a cross section of a metal oxide semiconductor array substrate after patterns of source and drain electrodes are formed in accordance with another embodiment of the invention.

Step h): as illustrated in FIG. 19, depositing a source and drain metal layer on the base substrate done with step g), and forming the source and drain electrodes by way of a patterning process;

As an example, the photoresist 11 is peeled, and a source and drain electrode metal layer is deposited on the base substrate 1 done with step g) by way of magnetron sputtering, heat evaporation or other film formation method. Material of the source and drain metal layer may be a metal such as Cr, W, Ta, Mo, Al, Cu, etc. or alloy thereof. The source and drain metal layer may be made up of a plurality of metal films. After that, a layer of photoresist is applied on the source and drain electrode metal layer, and then exposed using a mask to form a photoresist-removed region and a photoresist-retained region; the photoresist-retained region corresponds to a region having the pattern of the source and drain electrodes, and the photoresist-removed region corresponds to the remaining region. Then a developing process is performed so that the photoresist in the photoresist-removed region is completely removed and the thickness of the photoresist in the photoresist-retained region remains the same. The source and drain electrode metal film in the photoresist-removed region is etched away completely by way of an etching process to form the pattern of the source and drain electrodes 6 and a third via hole 9. Finally the remaining photoresist is peeled off.

It can be understood that, a passivation layer, a pixel electrode or other functional layers may be further formed by way of known patterning process to finally form the metal oxide thin film transistor, which will not be elaborated herein.

In the embodiment of the invention, after the first via holes 7 are etched for the first time, due to the disposition of the second via holes 8 in the active layer 4, the channel length of the active layer 4 is shortened to form a narrow channel metal oxide TFT with a higher charging rate, which increase the display effect.

After the first via holes 7 are etched once again, the surface of part of the active layer 4 facing the etch stop layer 5 is exposed and contacts the source and drain electrodes 6 during the subsequent step of depositing the source and drain electrodes 6, thereby the source and the drain electrodes 6 contact the active layer 4 better. At the same time, as the surface of the part of the active layer 4 facing the etch stop layer 5 contacts the source and drain electrodes 6, the channel length L1 of the active layer is further shortened.

Example 3

The embodiment of the invention provides an array substrate comprising any of the above thin film transistors. It can be understood that, the array substrate may further comprise other functional layers.

Example 4

The embodiment of the invention provides a display device comprising the above array substrate. It can be understood that, the display device may further comprise other components such as a color filter substrate, a liquid crystal layer, a polarizer, and the like, which is known to those skilled in the art, and will neither be elaborated here nor be limitative to the disclosure.

The display device is for example a LCD panel, an E-paper, an OLED panel, a mobile phone, a television, a display, a laptop computer, a digital photo-frame, a navigator or any products or components with a display function.

What is described above is related to the illustrative embodiments of the disclosure only and not limitative to the scope of the disclosure; the scopes of the disclosure are defined by the accompanying claims.

The present application claims priority from Chinese Application No. 201410334569.1, filed on Jul. 14, 2014, the disclosure of which is incorporated herein by reference in its entirety.

What is claimed is:

1. A thin film transistor, comprising an active layer, an etch stop layer disposed on the active layer as well as a source electrode and a drain electrode disposed on the etch stop layer, wherein the source electrode and the drain electrode are disposed in a same layer and separated from each other, a first via hole is formed in the etch stop layer, a second via hole is formed in a position of the active layer corresponding to the first via hole, and each of the source electrode and the drain electrode is connected to the active layer through the first via hole formed in the etch stop layer and the second via hole formed in the active layer, wherein a length of the second via hole is larger than that of the first via hole.

2. The thin film transistor of claim 1, further comprising an electrically conductive layer, wherein the source electrode and the drain electrode are disposed on the electrically conductive layer, and the source electrode and the drain electrode are connected to the active layer through the electrically conductive layer.

3. The thin film transistor of claim 2, wherein the electrically conductive layer comprises an electrically conductive adhesive.

4. The thin film transistor of claim 3, wherein the electrically conductive adhesive comprises nanoparticles which are made of material comprises at least one of silver, copper or aluminum.

5. The thin film transistor of claim 1, wherein a size of the first via hole is larger than that of the second via hole, and the source electrode and the drain electrode contact a surface of part of the active layer facing the etch stop layer.

6. The thin film transistor of claim 1, wherein the active layer is made of a metal oxide semiconductor material.

7. The thin film transistor of claim 6, wherein the active layer is made of IGZO, ZnO or ITZO.

8. A method for fabricating a thin film transistor, comprising:
    forming an active layer of the thin film transistor;
    forming an etch stop layer on the active layer;
    forming a first via hole in the etch stop layer;
    forming a second via hole in a position of the active layer corresponding to the first via hole;
    forming a source electrode and a drain electrode of the thin film transistor, wherein each of the source electrode and the drain electrode is connected to the active layer through the first via hole and the second via hole;
    wherein a length of the second via hole is larger than that of the first via hole.

9. The method for fabricating the thin film transistor of claim 8, further comprising: forming an electrically conductive layer on the etch stop layer, wherein the source electrode and the drain electrode are connected to the active layer through the electrically conductive layer.

10. The method for fabricating the thin film transistor of claim 9, wherein the step of forming the electrically conductive layer on the etch stop layer comprises applying an electrically conductive adhesive onto the etch stop layer.

11. The method for fabricating the thin film transistor of claim 10, wherein the electrically conductive adhesive comprises nanoparticles which are made of material comprises at least one of silver, copper or aluminum.

12. The method for fabricating the thin film transistor of claim 9, wherein the step of forming the source electrode and the drain electrode of the thin film transistor and the step of forming the electrically conductive layer on the etch stop layer are accomplished through one patterning process.

13. The method for fabricating the thin film transistor of claim 8, wherein the step of forming the first via hole in the etch stop layer and the step of forming the second via hole in a position of the active layer corresponding to the first via hole are accomplished through one patterning process.

14. The method for fabricating the thin film transistor of claim 8, wherein after forming the second via hole in a position of the active layer corresponding to the first via hole, the method further comprises: asking a photoresist formed on the etch stop layer in positions corresponding to two opposite sides of the first via hole to form an exposed part of the etch stop layer; and etching the exposed part of the etch stop layer to expose a part of the active layer.

15. The method for fabricating the thin film transistor of claim 1, wherein the active layer is made of a metal oxide semiconductor material.

16. The method for fabricating the thin film transistor of claim 15, wherein the active layer is made of IGZO, ZnO or ITZO.

17. An array substrate comprising the thin film transistor of claim 1.

18. A display device comprising the array substrate of claim 17.

* * * * *